United States Patent [19]

Poppert et al.

[11] Patent Number: 4,633,290
[45] Date of Patent: Dec. 30, 1986

[54] MONOLITHIC CMOS INTEGRATED CIRCUIT STRUCTURE WITH ISOLATION GROOVES

[75] Inventors: Paul E. Poppert, Acton; Marvin J. Tabasky, Peabody; Eugene O. Degenkolb, Wayland, all of Mass.

[73] Assignee: GTE Laboratories Incorporated, Waltham, Mass.

[21] Appl. No.: 834,713

[22] Filed: Feb. 28, 1986

Related U.S. Application Data

[62] Division of Ser. No. 687,409, Dec. 28, 1984, Pat. No. 4,593,459.

[51] Int. Cl.$^4$ .................... H01L 27/02; H01L 27/04; H01L 29/06; H01L 29/04
[52] U.S. Cl. ........................................ 357/42; 357/50; 357/55; 357/59
[58] Field of Search ................... 357/42, 50, 55, 59

[56] References Cited

U.S. PATENT DOCUMENTS

| | | | |
|---|---|---|---|
| 3,861,968 | 1/1975 | Magdo et al. | 357/50 |
| 4,209,797 | 6/1980 | Egawa et al. | 357/42 |
| 4,327,476 | 5/1982 | Iwai et al. | 29/571 |
| 4,400,411 | 8/1983 | Yuan et al. | 427/86 |
| 4,474,624 | 10/1984 | Matthews | 357/42 |
| 4,477,310 | 10/1984 | Park et al. | 357/42 |
| 4,554,726 | 11/1985 | Hillenius | 357/42 |
| 4,558,508 | 12/1985 | Kinney et al. | 357/42 |

*Primary Examiner*—Gene M. Munson
*Attorney, Agent, or Firm*—David M. Keay

[57] ABSTRACT

Method of forming a substrate for fabricating CMOS FET's by forming sections of N and P-type conductivity in a body of silicon. Grooves are etched in the N and P-type sections to produce N and P-type sectors encircled by grooves. The surfaces of the grooves are oxidized, the grooves are filled with polycrystalline silicon, and exposed surfaces of the polycrystalline silicon are oxidized to form barriers which encircle the sectors and electrically isolate them. Shallow trenches are etched in regions of the body outside the N and P-type sectors and the trenches are filled with regions of silicon dioxide. A pair of complementary FET's are fabricated in the two sectors and a metal interconnection between them overlies a portion of a region of silicon dioxide.

5 Claims, 10 Drawing Figures

MONOLITHIC CMOS INTEGRATED CIRCUIT STRUCTURE WITH ISOLATION GROOVES

This is a divisional of co-pending application Ser. No. 687,409 filed on Dec. 28, 1984, now U.S. Pat. No. 4,593,459.

BACKGROUND OF THE INVENTION

This invention relates to semiconductor integrated circuit structures. More particularly, it is concerned with substrates for the fabrication of semiconductor integrated circuit devices therein and the methods of producing such substrates.

Monolithic integrated circuit structures containing complementary metal-oxide-silicon (CMOS) devices are well-known. Typically, a complementary pair of devices are fabricated in adjacent sections of opposite conductivity type within a body of silicon. Metal interconnections between the gates and the source/drain regions of the devices and to other circuit components are formed on the surface of the body overlying a nonconductive coating.

In integrated circuit structures of this type each section of the silicon body which contains the active regions of a CMOS device must be electrically isolated so as to prevent interaction with other regions of the body. In addition, it is desirable to reduce the capacitive effects caused by conductive interconnections overlying relatively low resistivity silicon and separated therefrom by intermediate insulating material.

SUMMARY OF THE INVENTION

The method in accordance with the present invention provides for producing an improved substrate for the fabrication of semiconductor integrated circuit devices therein having electrical isolation between devices and reduced capacitive effects caused by interconnections. The method for producing a substrate in accordance with the present invention includes providing a body of semiconductor material which has an underlying layer of one conductivity type with a first section of one conductivity type and a second section of the opposite conductivity type at a surface of the body. The first and second sections are contiguous at a junction, and the first and second sections are each contiguous with the underlying layer at an interface which is parallel with the surface. Grooves are formed in the first and second sections and extend from the surface to beyond the interface, thus providing a first isolated sector of the first section encircled by grooves and a second isolated sector of the second section encircled by grooves. Next, a coating of adherent nonconductive protective material is formed on the exposed semiconductor material of the grooves and the grooves are filled with a semiconductor fill material. A coating of adherent nonconductive protective material is formed on the surface of the semiconductor fill material adjacent to the surface of the body to enclose the semiconductor fill material with nonconductive protective material. Semiconductor material is removed from a portion of the first and second sections at the junction to form a trench extending into the body from the surface. The trench is filled with adherent nonconductive protective material.

In fabricating a complementary pair of MOS devices in the substrate, an adherent gate layer of insulating material is placed on the surface of the first and second sectors. A first gate member of semiconductor material of low resistivity is placed over a portion of the gate layer of insulating material overlying a channel region of the first sector with the channel region lying between two source/drain regions of the first sector. A second gate member of semiconductor material of low resistivity is placed over a portion of the gate layer of insulating material overlying a channel region of the second sector with the channel region lying between two source/drain regions of the second sector. Conductivity type imparting material of the opposite conductivity type is introduced into the two source/drain regions of the first sector and conductivity type imparting material of the one conductivity type is introduced into the two source/drain regions of the second sector. Insulating material is removed to expose areas of the two source/drain regions of the first sector and areas of two source/drain regions of the second sector at the surface. Adherent conductive connections are formed in ohmic contact with the exposed areas; one of the connections connects a source/drain region of the first sector and a source/drain region of the second sector and overlies the nonconductive protective material filling the trench.

A substrate in accordance with the present invention comprises a body of semiconductor material having an underlying layer of one conductivity type and having a first section of one conductivity type and a second section of the opposite conductivity type at a surface of the body. The first and second sections are contiguous at a junction and the first and second sections are contiguous with the underlying layer at an interface parallel with the surface. A first isolated sector of the first section is encircled by first barriers extending from the surface to the underlying layer, and a second isolated sector of the second section is encircled by second barriers extending from the surface to the underlying layer. Each of the first and second barriers is of semiconductor fill material enclosed by nonconductive protective material. A region of adherent nonconductive protective material is inset in the first and second sections at the junction and extends between the first and second barriers.

A monolithic integrated circuit structure employing the foregoing substrate and incorporating complementary field effect transistors in accordance with the present invention includes two source/drain regions of the opposite conductivity type inset in the first sector defining a channel region of one conductivity type therebetween and two source/drain regions of the one conductivity type inset in the second sector and defining a channel region of the opposite conductivity type therebetween. A gate layer of insulating material overlies the channel region in the first sector and a gate layer of insulating material overlies the channel region in the second sector. A gate member of semiconductor material of low resistivity overlies the channel region in the first sector with the gate layer of insulating material interposed therebetween, and a gate member of semiconductor material of low resistivity overlies the channel region in the second sector with the gate layer of insulating material interposed therebetween. Adherent conductive connections are in ohmic contact with the source/drain regions at the surface. One of the connections connects a source/drain region of the first sector and a source/drain region of the second sector and overlies a portion of the region of adherent nonconductive protective material inset in the first and second section at the junction.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following disclosure and appended claims in connection with the above-described drawings.

DETAILED DESCRIPTION OF THE INVENTION

In fabricating a monolithic integrated circuit structure containing complementary metal-oxide-silicon field effect transistors (CMOS FET's) as illustrated in the figures a wafer or slice of single crystal semiconductor material of one conductivity type is provided as a supporting structure. As is well-understood the slice or wafer is usually of relatively large surface area upon which many identical circuit networks each including many devices are fabricated simultaneously. However, for purposes of illustration the fabrication of only a pair of complementary FET's in a fragment of a slice is shown and described. In the following description silicon is employed as the semiconductor material and the starting slice is of P-type conductivity.

Figure 1:
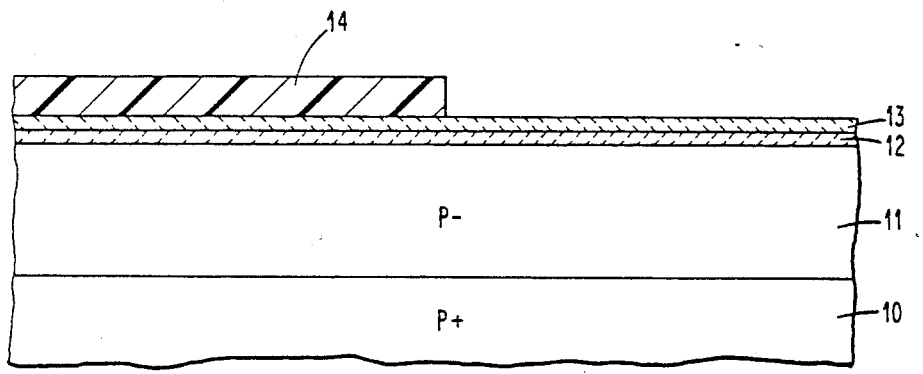
FIGS. 1 through 10 are a series of elevational views in cross-section of a fragment of a wafer of semiconductor material illustrating the fragment at various stages during the fabrication of a substrate and CMOS devices therein in accordance with the present invention.

A slice or wafer of P-type single crystal silicon of uniform relatively low resistivity having flat, planar, parallel opposed major surfaces, a fragment 10 of which is illustrated in FIG. 1, is produced by any of the known techniques of crystal fabrication including appropriate slicing and cleaning operations. An epitaxial layer 11 of P-type silicon of uniform, relatively high resistivity is grown on the surface of the slice as by known vapor decomposition techniques. A layer 11 which is precisely controlled as to thickness and as to resistivity and which is a continuation of the crystalline structure of the single crystal slice 10 is thus deposited on the surface of the slice. The upper surface of the epitaxial layer 11 is parallel to the interface between the original slice and the layer.

Next, a layer of silicon dioxide 12 and a layer of silicon nitride 13 are deposited on the surface of the layer. A photoresist material is applied and suitable masking techniques are employed to provide a layer of photoresist material 14 overlying certain sections of the body of silicon and not overlying other sections as illustrated in FIG. 1. The portion of the layer of silicon nitride 13 not protected by the layer of photoresist material 14 is removed by etching. An N-type conductivity imparting material, specifically phosphorus, is then introduced into the epitaxial layer 11 by known ion implantation techniques. The N-type conductivity imparting material passes through the silicon dioxide layer 12 but the section of the body underlying the photoresist material 14 and silicon nitride 13 are protected from the implanted material. Thus an N-type section 21 is formed in the body extending from the surface through the epitaxial layer to the underlying slice 10.

Figure 2:
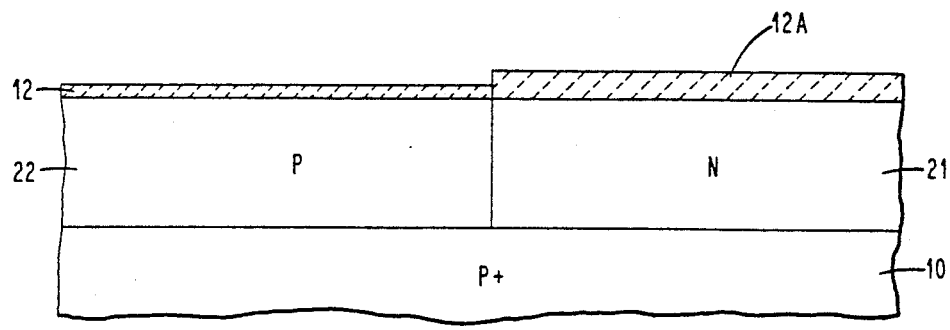

The photoresist material 14 is then removed and the silicon dioxide layer 12A over the N-type section 21 is increased in thickness. The oxide does not grow on the portion of the body that is protected by the remainder of the silicon nitride layer 13. After a suitably thick silicon dioxide layer 12A has been grown over the N-type section 21, the remainder of the silicon nitride layer 13 is removed. A P-type conductivity imparting material, specifically boron, is ion implanted through the thin silicon dioxide layer 12 while the thicker silicon dioxide 12A protects the underlying N-type section 21. The resulting silicon body is illustrated in FIG. 2. A P-type section 22 has been formed extending from the surface through the epitaxial layer to the underlying slice 10. The P-type section 22 and an N-type section 21 are contiguous at a PN junction 23 between them, and both have an interface with the underlying original slice 10 which is parallel with the surface of the body.

Figure 3:
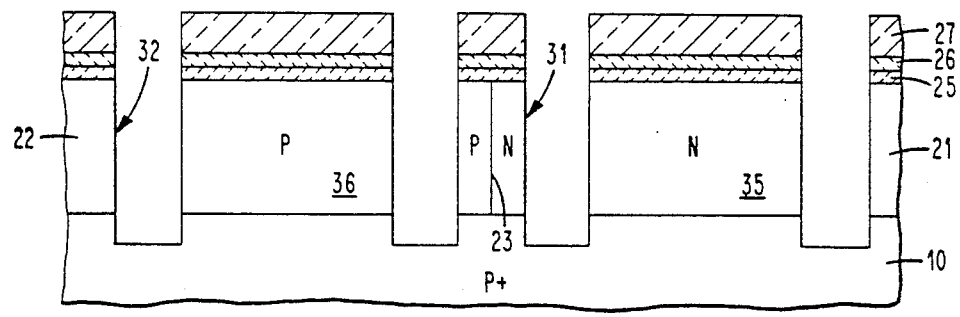

The body is then treated to remove the silicon dioxide layers 12, 12A. A layer of silicon dioxide 25 and a layer of silicon nitride 26 are formed on the surface of the body as shown in FIG. 3. A layer 27 of a chemically vapor deposited glass is deposited over the silicon nitride layer 26. The layer of glass 27 is suitably masked and selectively removed to form a pattern therein. The body is subjected to anisotropic reactive ion etching techniques to etch through the silicon nitride layer 26, the silicon dioxide layer 25, and into the silicon of the N and P-type sections 21 and 22, respectively, to form sets of grooves 31 and 32. The set of grooves 31 extend from the surface of the body through to the underlying silicon slice 10. The grooves 31 completely encircle a sector 35 of N-type section 21. Similarly, the set of grooves 32 extend through the P-type section 22 to the underlying slice 10 to isolate a sector 36 of P-type conductivity. For fabricating typical CMOS FET's the grooves 31 and 32 are approximately one micron wide by five microns deep. The body at this stage of the process is illustrated in FIG. 3.

Figure 4:
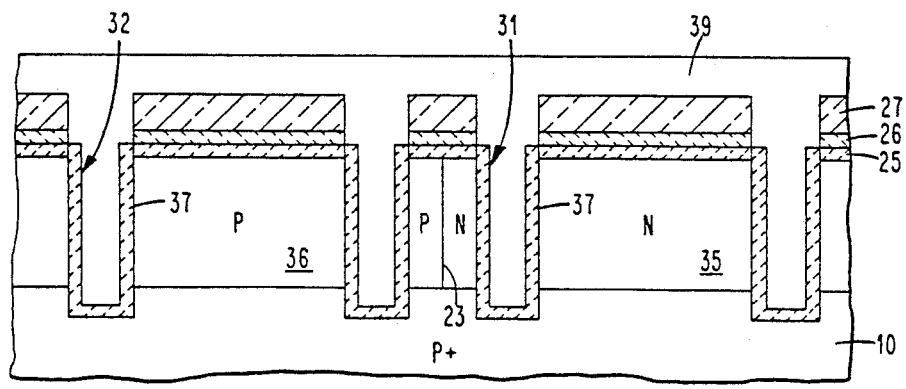
Figure 5:
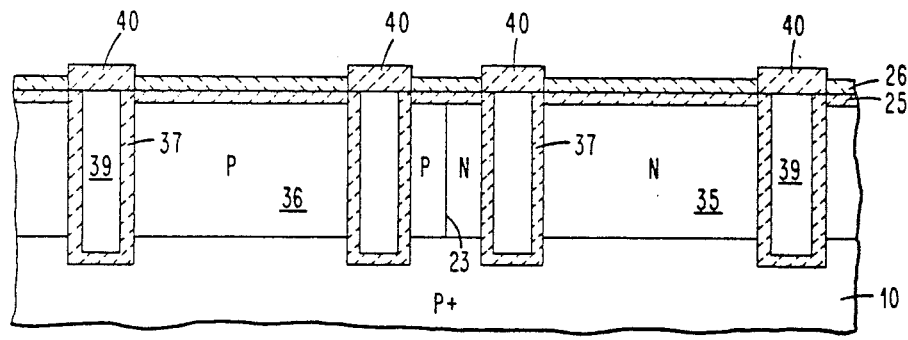

The body is then treated by heating in an oxidizing atmosphere to grow an adherent nonconductive protective coating of silicon dioxide 37 over the exposed surfaces of the silicon which define the walls of the grooves 31 and 32 as illustrated in FIG. 4. Polycrystalline silicon 39 is deposited on the body so as to fill the grooves 31 and 32. Excess polycrystalline silicon 39 together with the layer of chemically vapor deposited glass 27 are removed so as to leave a generally planar surface. The body is then treated in a heated oxidizing atmosphere to convert the exposed surface of polycrystalline line silicon 39 in the grooves to silicon dioxide 40 as illustrated in FIG. 5. The layer of silicon nitride 26 prevents oxidization in the underlying regions. Thus, as illustrated in FIG. 5 the N-type sector 35 is completely encircled between the surface and the interface with the slice 10 by an isolating barrier of polycrystalline silicon fill material 39 which is itself completely enclosed by adherent nonconductive silicon dioxide 37, 40. Similarly the P-type sector 36 is encircled by a barrier of polycrystalline silicon fill material 39 enclosed by silicon dioxide 37, 40.

Figure 6:
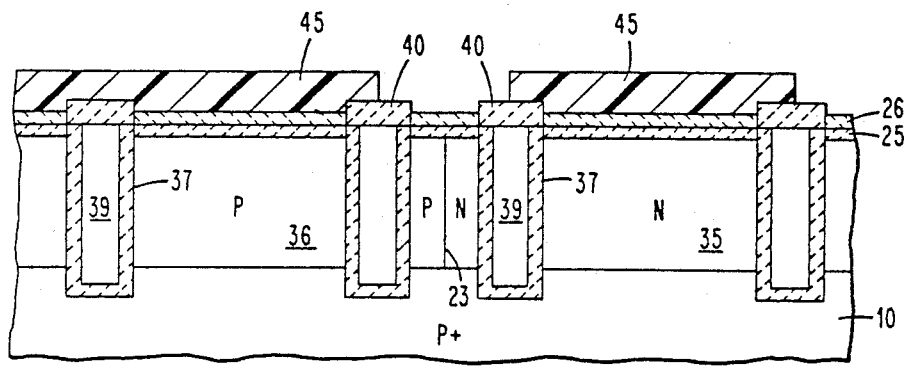
Figure 7:
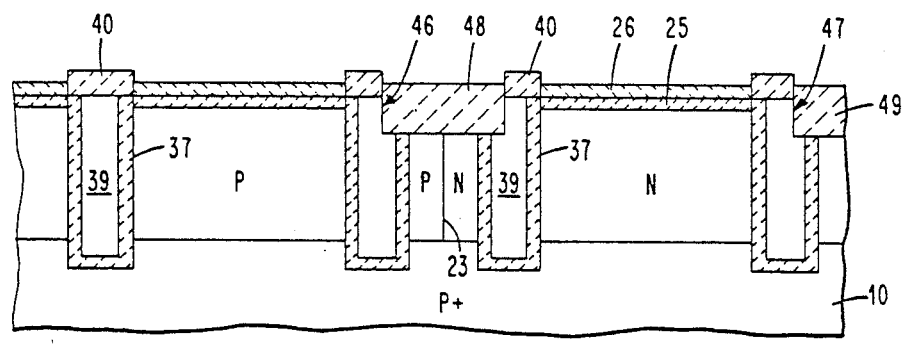

As shown in FIG. 6 a layer of photoresist material 45 is then placed on the surface of the silicon dioxide layer 25 leaving unprotected only certain regions including the portions of the P and N-type sections between the sectors 35 and 36 and adjacent to the PN junction 23. The photoresist material 45 extends over portions of the silicon oxide 40 of the isolating barriers to insure that all active sections of the body are completely protected. The body is subjected to etching procedures to remove material not protected by the photoresist material 45. As illustrated in FIG. 7 silicon is removed from portions of the N and P-type sections adjacent to the junction 23 and outside the N and P-type sectors 35 and 36, respectively, to form a shallow trench 46. Another shallow trench 47 is formed in a portion of the body outside the sectors 35 and 36. The trenches 46 and 47 may be of the order of two or three microns deep. Silicon dioxide is deposited in the trenches 46 and 47 to produce regions 48 and 49 of relatively thick layers of silicon dioxide as illustrated in FIG. 7.

The resulting substrate as illustrated in FIG. 7 includes the slice 10 of low resistivity P-type silicon and the two isolated sectors 35 and 36 of N-type and P-type, respectively. Each sector is completely encircled by barriers of polycrystalline silicon fill material 39 enclosed in silicon dioxide 37 and 40. The barriers extend from the surface into the original material of the slice 10 providing electrical isolation between the sectors 35 and 36. Regions outside the sectors are protected by relatively thick silicon dioxide layers 48 and 49 which provide spacing between their upper surface and the underlying relatively low resistivity silicon.

Figure 8:
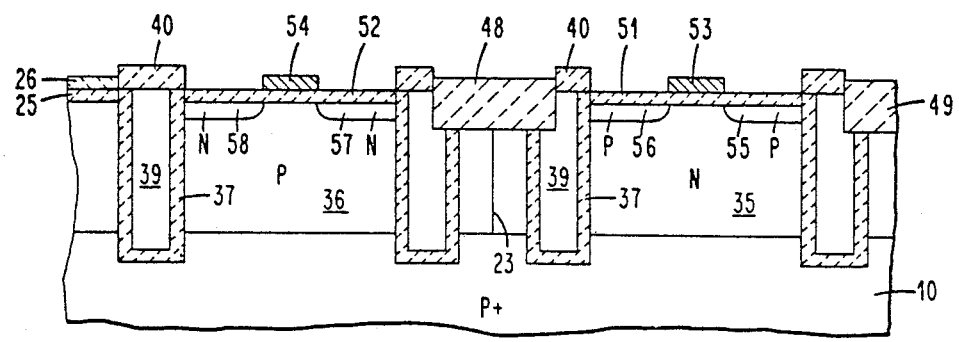

A pair of CMOS FET's may be fabricated within the isolated N and P-type sectors 35 and 36, respectively, employing conventional techniques. As illustrated in FIG. 8 the layers of silicon nitride 26 and silicon dioxide 25 are removed from the sectors 35 and 36 and replaced by gate insulating layers 51 and 52 of silicon dioxide. Using conventional techniques of deposition, masking, and etching conductive gate members 53 and 54 of low resistivity polycrystalline silicon are formed on the surfaces of the gate insulating layers 51 and 52, respectively.

By employing conventional ion implantation techniques and masking as necessary P-type conductivity imparting material is ion implanted through the gate insulating layer 51 into the regions 55 and 56 of the N-type sector 35 not shielded by the gate member 53. Similarly N-type conductivity imparting material is ion implanted through the gate insulating layer 52 into regions 57 and 58 of the P-type sector 36 not shielded by the gate member 54. The P-type regions 55 and 56 define the source/drain regions and the intervening N-type region the channel region for one FET. The N-type regions 57 and 58 define the source/drain regions and the intervening P-type region the channel region for the complementary FET.

Figure 9:
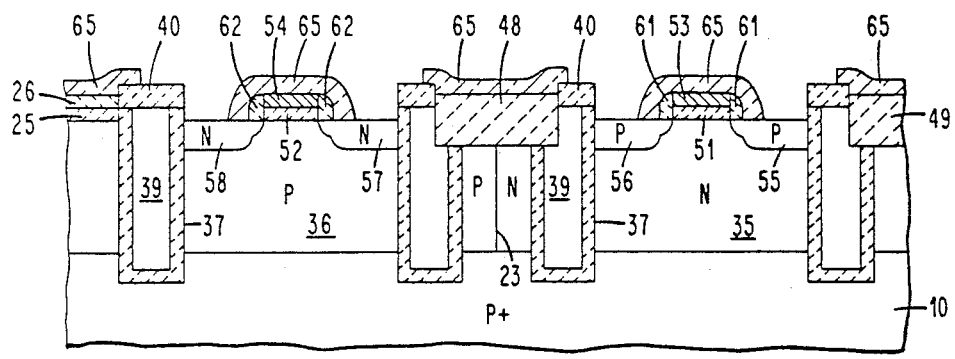

Next, in a series of deposition, masking, and etching steps the edge surfaces of the polycrystalline gate members 53 and 54 are protected by appropriate insulating material, such as a chemically vapor deposited glass, 61 and 62 as shown in FIG. 9. Additional conductivity type imparting materials are ion implanted to extend the depth of the P-type source/drain regions 55 and 56 and the N-type source/drain regions 57 and 58. Employing conventional techniques the surfaces of the polycrystalline silicon gate members 53 and 54 and the surfaces of the source/drain regions 55, 56, 57, and 58 are silicided to improve conductivity. The surface of the body is then covered with a suitable dielectric, such as a chemically vapor deposited glass, to form an adherent protective layer 65. Portions of the glass layer 65 are selectively removed to expose areas of the surfaces of the gate members 53 and 54 and the source/drain regions 55, 56, 57, and 58.

Figure 10:
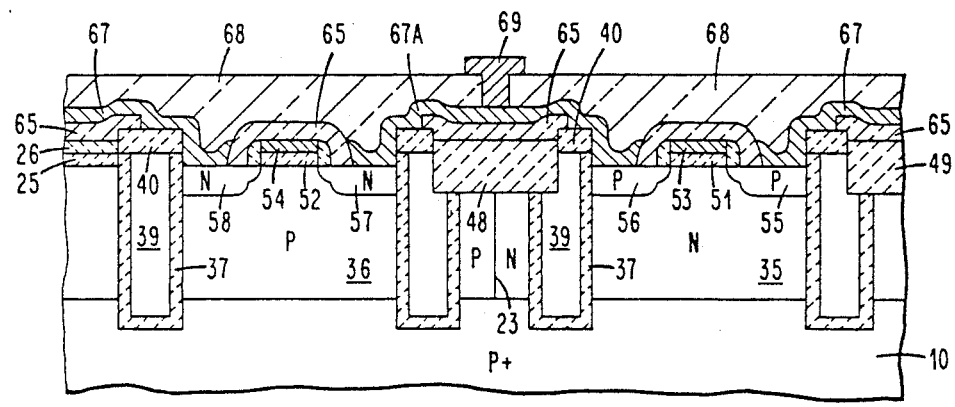

As illustrated in FIG. 10 a first layer of metal interconnections 67 are applied by employing known techniques of metallization, masking, and etching. One interconnection 67A provides a direct conductive path from a source/drain region 56 of one FET to a source/drain region 57 of the other FET. This interconnection passes over the region of the PN junction 23 and is spaced therefrom by the thick silicon dioxide layer 48. Similarly, the thick silicon dioxide layer 49 separates the overlying metal connection from the underlying silicon.

A second layer of dielectric material 68, specifically chemically vapor deposited glass, is deposited on the body and appropriately treated to provide a planar surface. Openings are formed in the second dielectric layer 68 as necessary to permit making contact to the underlying metal interconnections 65 as illustrated by contact 69.

Thus as illustrated in FIG. 10 a body of silicon containing a complementary pair of MOS FET's is provided in which the sectors of silicon containing the active devices are electrically isolated by encircling nonconductive barriers. In addition thick layers of insulation are provided between low resistivity silicon and metal interconnections thus reducing capacitive effects which are detrimental to high speed operation of the devices.

While there has been shown and described what is considered a preferred embodiment of the present invention, it will be obvious to those skilled in the art that various changes and modifications may be made therein without departing from the invention as defined by the appended claims.

What is claimed is:

1. A substrate for the fabrication of semiconductor integrated circuit devices therein comprising
   a body of semiconductor material having an underlying layer of one conductivity type and having a first section of one conductivity type and a second section of the opposite conductivity type at a surface of the body;
   said first and second sections being contiguous at a junction and said first and second sections being contiguous said underlying layer at an interface parallel with said surface;
   a first isolated sector of said first section encircled by first barriers extending from said surface to said underlying layer;
   a second isolated sector of said second section encircled by second barriers extending from said surface to said underlying layer;
   each of said first and second barriers being of semiconductor fill material enclosed by nonconductive protective material; and
   a region of adherent nonconductive protective material inset in said first and second sections at said junction and extending between said first and second barriers.

2. A substrate in accordance with claim 1 wherein said body of semiconductor material is of single crystal silicon;
   said semiconductor fill material is polycrystalline silicon; and
   said nonconductive protective material is silicon dioxide.

3. Monolithic integrated circuit structure incorporating complementary field effect transistors comprising
   a body of semiconductor material having an underlying layer of one conductivity type and having a first section of one conductivity type and a second section of the opposite conductivity type at a surface of the body;

said first and second sections being contiguous at a junction and said first and second sections being contiguous said underlying layer at an interface parallel with said surface;

a first isolated sector of said first section encircled by first barriers extending from said surface to said underlying layer;

a second isolated sector of said second section encircled by second barriers extending from said surface to said underlying layer;

each of said first and second barriers being of semiconductor fill material enclosed by nonconductive protective material;

a region of adherent nonconductive protective material inset in said first and second sections at said junction and extending between said first and second barriers;

two source/drain regions of the opposite conductivity type inset in said first sector and defining a channel region of the one conductivity type therebetween;

two source/drain regions of the one conductivity type inset in said second sector and defining a channel region of the opposite conductivity type therebetween;

a gate layer of insulating material overlying the channel region in said first sector and a gate layer of insulating material overlying the channel region in said second sector;

a gate member of semiconductor material of low resistivity overlying the channel region in said first sector with the gate layer of insulating material interposed therebetween;

a gate member of semiconductor material of low resistivity overlying the channel region in said second sector with the gate layer of insulating material interposed therebetween; and adherent conductive connections in ohmic contact with said source/drain regions at said surface, one of said connections connecting a source/drain region of said first sector and a source/drain region of said second sector and overlying a portion of said region of adherent nonconductive protective material inset in said first and second sections of said junction.

4. Monolithic integrated circuit structure in accordance with claim 3 wherein said body of semiconductor material is of single crystal silicon;

said semiconductor fill material is polycrystalline silicon; and said nonconductive protective material is silicon dioxide.

5. Monolithic integrated circuit structure in accordance with claim 4 wherein said gate members of semiconductor material are polycrystalline silicon; and said gate layers of insulating material are of silicon dioxide.

* * * * *